US006972218B2

(12) United States Patent
Kishiro

(10) Patent No.: US 6,972,218 B2
(45) Date of Patent: Dec. 6, 2005

(54) SEMICONDUCTOR DEVICE AND FABRICATING METHOD THEREOF

(75) Inventor: Koichi Kishiro, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 18 days.

(21) Appl. No.: 10/736,607

(22) Filed: Dec. 17, 2003

(65) Prior Publication Data

US 2004/0207014 A1 Oct. 21, 2004

(30) Foreign Application Priority Data

Apr. 17, 2003 (JP) ............................ 2003-113381

(51) Int. Cl.[7] ............................................... H01L 21/00

(52) U.S. Cl. ...................... 438/149; 438/151; 438/152; 438/164

(58) Field of Search ................................ 438/149, 151, 438/152, 162, 164, 299, 301, 306, 308; 257/347, 257/349, 352

(56) References Cited

U.S. PATENT DOCUMENTS

| | | | | |
|---|---|---|---|---|
| 6,420,767 | B1 * | 7/2002 | Krishnan et al. | 438/301 |
| 6,433,609 | B1 * | 8/2002 | Voldman | 327/313 |
| 6,521,957 | B2 * | 2/2003 | Patelmo et al. | 257/390 |
| 6,682,966 | B2 * | 1/2004 | Iwata et al. | 438/207 |
| 2003/0209761 | A1 * | 11/2003 | Yagishita et al. | 257/347 |
| 2004/0146701 | A1 * | 7/2004 | Taguchi | 428/209 |

FOREIGN PATENT DOCUMENTS

| | | |
|---|---|---|
| JP | 9-283766 | 10/1997 |
| JP | 11-354631 | 12/1999 |
| JP | 2002-83972 | 3/2002 |
| JP | 2002-110951 | 4/2002 |

* cited by examiner

*Primary Examiner*—Kevin M. Picardat
(74) *Attorney, Agent, or Firm*—Volentine Francos & Whitt, PLLC

(57) ABSTRACT

The present invention relates to a method of fabricating a semiconductor device that allows assuredly ion implanting an impurity to a support substrate and a semiconductor device that can rapidly operate an electric potential of the support substrate. According to the present fabricating method, an impurity is ion implanted over an entire surface of a support substrate under a buried oxide film; accordingly, the impurity can be delivered to other than a bottom portion of a contact hole. Accordingly, a low electric resistance layer extending from a lower portion of an element formation region to a lower portion of an element isolation region can be formed. As a result, an electric current can be flowed much from a contact to the support substrate at the lower portion of the element formation region. Accordingly, electric charges can be rapidly supplied to the support substrate at the lower portion of the element formation region, resulting in rapid operation of an electric potential of the support substrate at the lower portion of the element formation region.

18 Claims, 4 Drawing Sheets

SEMICONDUCTOR DEVICE AND FABRICATING METHOD THEREOF

BACKGROUND OF THE INVENTION

1. Field of the Invention

The present invention relates to a method of fabricating a semiconductor device in which by use of an SOI (Silicon on Insulator) substrate an electric potential of a support substrate can be fixed, and also relates to a semiconductor device fabricated according to the method.

2. Description of the Related Art

An SOI substrate is a semiconductor substrate that has a structure in which an SOI layer and a support substrate are separated by a buried oxide film. A transistor formed on the SOI substrate, since the SOI layer thereon the transistor is formed is electrically isolated completely from the support substrate by a thick buried oxide film, has characteristics such as being small in the parasitic capacitance, not causing latch-up, being strong against the cross talk noise, and so on.

However, even when the SOI substrate is used, it is difficult to completely inhibit the cross talk from occurring between elements formed on the same substrate. As a countermeasure for this, there is a method in which an electric potential of the support substrate under the buried oxide film is fixed. However, in the case of a package whose support substrate side is covered with resin like a WCSP (Wafer-level Chip Size Package) being used, since direct electrical contact cannot be attained from the support substrate, it is necessary to form a contact from a wafer surface to the support substrate and thereby to establish electrical contact from the SOI layer side. At this time, in order to reduce the electrical resistance that is generated between the contact and the support substrate, a contact hole penetrating through an element isolation layer formed on the SOI layer and the buried oxide film is formed and, to the support substrate exposed at the bottom portion thereof, with the element isolation layer therein the contact hole is formed as a mask, ion implantation of a high concentration impurity is performed.

[Patent Literature No.1]

Japanese Patent Application Laid-Open (JP-A) No.11-354631

[Patent Literature No.2]

JP-A No. 2002-110951

[Patent Literature No.3]

JP-A No. 2002-83972

[Patent Literature No.4]

JP-A No. 9-283766

However, according to the method in which a contact hole is formed from the SOI layer side toward the support substrate and the ion implantation is performed to the support substrate at the bottom portion of the contact hole, in the case of a process where the miniaturization is advanced being used, an aspect ratio is increased; accordingly, there are worries in that the impurity may not sufficiently reach up to the support substrate.

Furthermore, even if the impurity could sufficiently reach the support substrate, a region where the impurity is implanted at a high concentration would be limited to the bottom portion of the contact hole. Accordingly, in the semiconductor device obtained according to such a method, over a region almost from the bottom portion of the contact hole to a lower portion of the element formation region, the impurity is not implanted at a high concentration. This will also cause the following problem.

In order to control the operation of the transistor formed in the element formation region in the SOI layer, in some cases, a electrical potential of the support substrate at the lower portion of the element formation region is manipulated, at this time, the manipulation is done by changing the electrical potential of a plug that buries the contact hole. However, as is noted above, in the region almost from the bottom portion of the contact hole of the support substrate to the lower portion of the element formation region, the impurity is not ion implanted at a high concentration; accordingly, the electrical resistance is high. Accordingly, in the region from the bottom portion of the contact hole of the support substrate to the lower portion of the element formation region, an electrical current cannot be flowed so much; accordingly, the supply of the electric charges to the support substrate at the lower portion of the element formation region is delayed. As a result, the manipulation of the electrical potential of the support substrate at the lower portion of the element formation region cannot be speedily performed.

SUMMARY OF THE INVENTION

In order to overcome the above mentioned problems, in the method of fabricating a semiconductor device according to the invention, an SOI layer that has an element formation region and an element isolation region through an oxide film on a substrate is formed, an impurity is ion implanted to the support substrate in the neighborhood of the oxide film so as to extend from the lower portion of the element formation region to the lower portion of the element isolation region to make the support substrate of a portion where the impurity is ion implanted low in the electric resistance, followed by heating the support substrate to form an element isolation layer in the element isolation region of the SOI layer, and thereby a plug that penetrates through the element isolation layer and the oxide film and reaches the low resistance region is formed.

DESCRIPTION OF THE PREFERRED EMBODIMENTS (First Embodiment)

FIGS. 1A through 4A are plan views showing a first embodiment according to the invention. Furthermore, FIGS. 1B through 4B are sectional views showing cross-sections when each of FIGS. 1A through 4A is cut along a dotted line XY. In the following, the first embodiment according to the invention will be explained with reference to the FIGS. 1 through 4. The first embodiment according to the invention is a method of fabricating a semiconductor device with an SOI substrate.

Figure 1A:
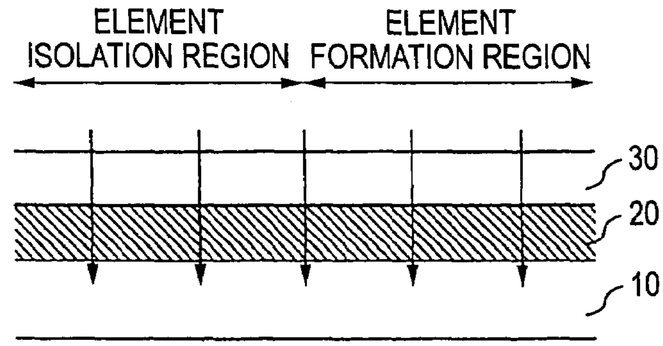
FIGS. 1A and 1B, respectively, are a sectional view and a plan view showing a first embodiment according to the present invention.
Figure 1B:
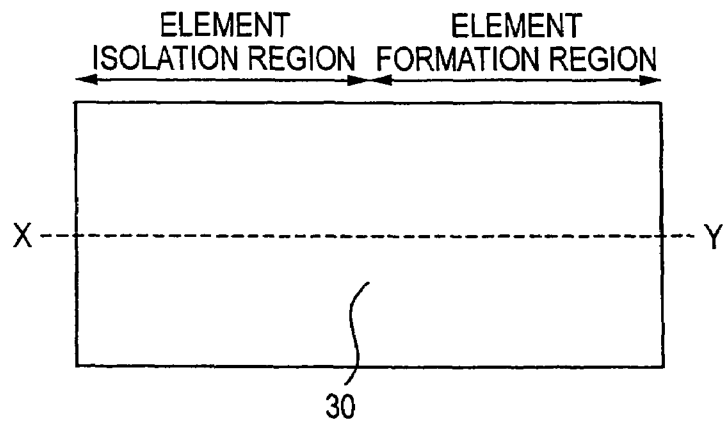

Firstly, as shown in FIGS. 1A and 1B, a semiconductor substrate that has a buried oxide film 20 between a support substrate 10 and an SOI layer 30 (hereinafter referred to as SOI substrate) is prepared. The SOI substrate may be any one of a wafer-like one and a chip obtained by dividing a wafer into individual chips. Furthermore, it may be either of one that is formed according to a SIMOX (Silicon IMplanted Oxide) method and one that is formed according to a lamination method. Still furthermore, the SOI layer 30 has an element formation region and an element isolation region. In the neighborhood of the buried oxide film 20 of the support substrate 10, an impurity is ion implanted at a high concentration of substantially 1E20 cm−-3, and thereby the neighborhood of the buried oxide film 20 of the support substrate 10 is made a low resistance layer 40. The impurity is ion implanted so as to extend at least from the support substrate 10 at the lower portion of the element formation region to the support substrate 10 at the lower portion of the element isolation region. As far as the condition is satisfied, the impurity can be ion implanted anywhere in the neighborhood of the buried oxide film 20 of the support substrate 10. For example, the ion implantation can be applied to an entire surface of the support substrate 10. The ion implantation is performed through the SOI layer 30 and the buried oxide film 20.

Then, the support substrate 10 is subjected to heat treatment. Since the impurity that is ion implanted to the support substrate 10 is diffused a certain degree owing to the heat treatment, an impurity that is ion implanted to the support substrate 10 is desirably low in the diffusion coefficient. This is because by suppressing the diffusion due to the heat treatment as low as possible, the electric resistance of the low resistance layer 40 formed by ion implantation of the impurity is suppressed from rising. For example, when the support substrate 10 is silicon, As and so on are desirable.

The above heat treatment is not necessarily applied immediately after the ion implantation of the impurity, and may be applied simultaneously with the heat treatment of a diffusion layer 70 when a transistor 60 is formed in the subsequent step or similarly simultaneously with the heat treatment when an element isolation region 50 is formed in the subsequent step. By thus performing, the number of times of the heat treatment can be reduced, the number of steps can be reduced, and thereby the diffusion of the impurity can be suppressed to the lowest possible limit.

Figure 2A:
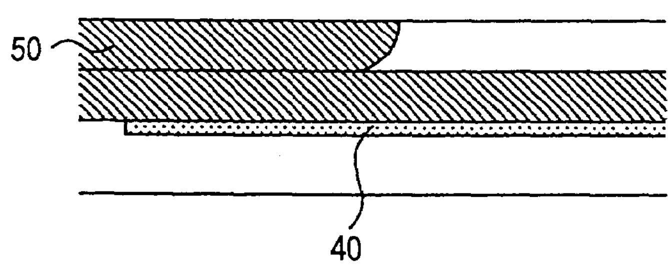
FIGS. 2A and 2B, respectively, are a sectional view and a plan view showing the first embodiment according to the invention.
Figure 2B:
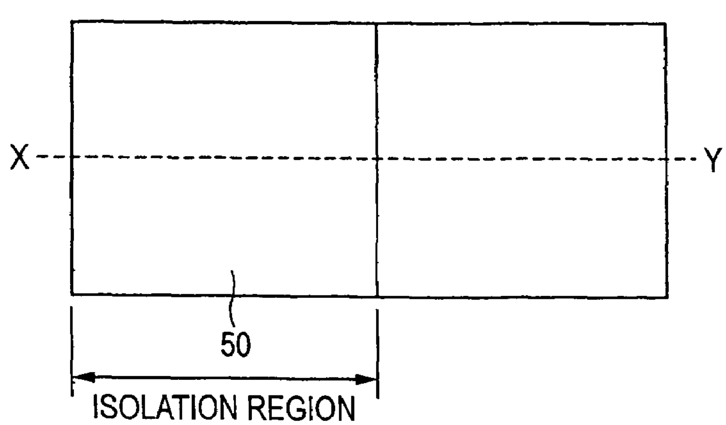

Subsequently, as shown in FIGS. 2A and 2B, the element isolation layer 50 is formed in the element isolation region of the SOI layer 30 according to the LOCOS method and so on, and a transistor 60 that has a diffusion layer 70 in the element formation region on the SOI layer 30 is formed.

Figure 3A:
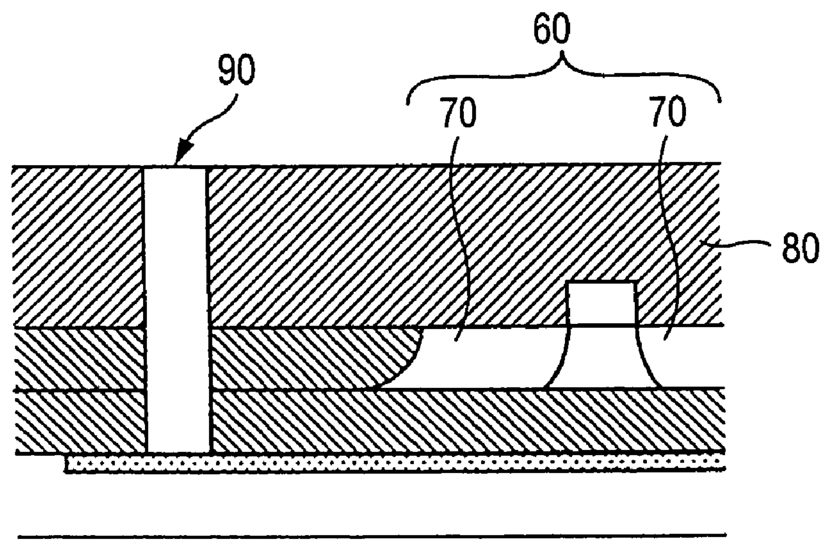
FIGS. 3A and 3B, respectively, are a sectional view and a plan view showing the first embodiment according to the invention.
Figure 3B:
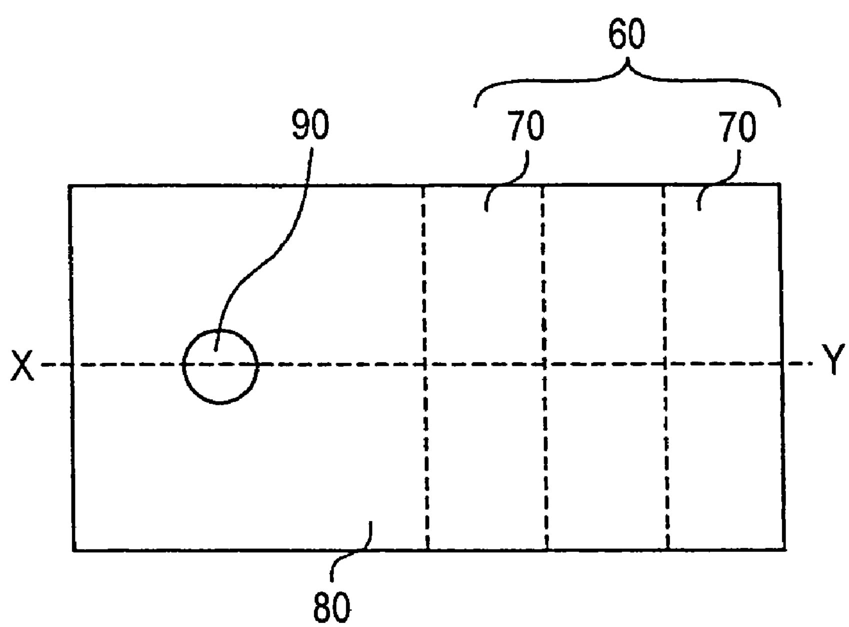

Then, as shown in FIGS. 3A and 3B, an interlayer insulating film 80 is deposited on the SOI layer 30 and the element isolation layer 50. Furthermore, a contact hole 90 that goes through the interlayer insulating film 80, element isolation layer 50 and buried oxide film 20 and reaches the support substrate 10 is formed.

Figure 4A:
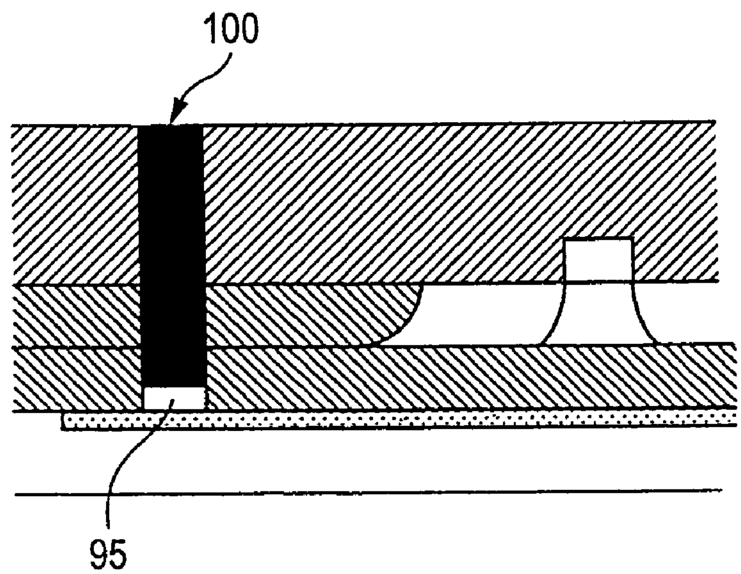
FIGS. 4A and 4B, respectively, are a sectional view and a plan view showing the first embodiment according to the invention.
Figure 4B:
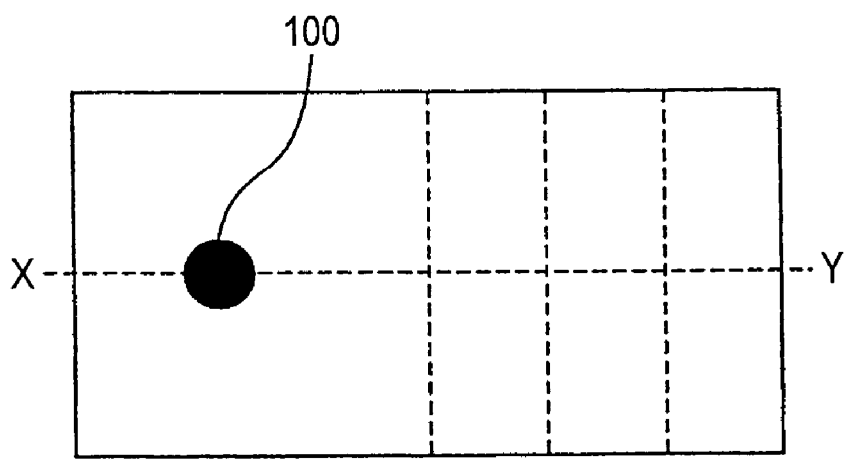

Lastly, as shown in FIGS. 4A and 4B, an adhesion layer 95 made of TiN is formed at the bottom portion of the contact hole 90, thereon a plug 100 made of W is deposited, and thereby the contact hole 90 is buried. Furthermore, in burying the contact hole 90, instead of W, Poly-Si into which an impurity is ion implanted may be used. In this case, by making the impurity that is ion implanted in the support substrate 10 and the impurity that is ion implanted in the Poly-Si the same conductivity type, the Schottky barrier is inhibited from occurring between the support substrate 10 and the plug 100.

As explained above, according to a method of fabricating a semiconductor device according to a first embodiment of the invention, when the impurity is ion implanted into the support substrate under the oxide film, the element isolation layer having the contact hole is not used as a mask. Since the impurity is ion implanted into the support substrate before an element and the element isolation layer are formed, the impurity can reach the support substrate irrespective of the aspect ratio of the contact hole.

Furthermore, instead of previously laminating the impurity ion implanted support substrate, buried oxide film and SOI layer each, the impurity is ion implanted to the support substrate of the completed SOI wafer. Accordingly, there is no chance that owing to the diffusion of the impurity that is ion implanted to the support substrate due to heat at the time of lamination, the electric resistance of a region where the impurity is ion implanted, that is, a low electric resistance layer becomes larger.

(Second Embodiment)

Figure 5A:
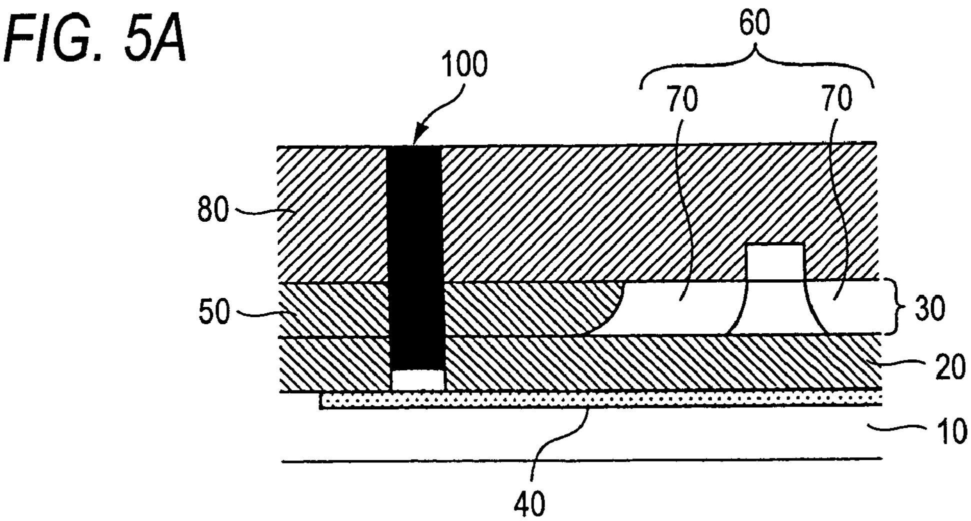
FIGS. 5A and 5B, respectively, are a sectional view and a plan view showing a second embodiment according to the invention.
Figure 5B:
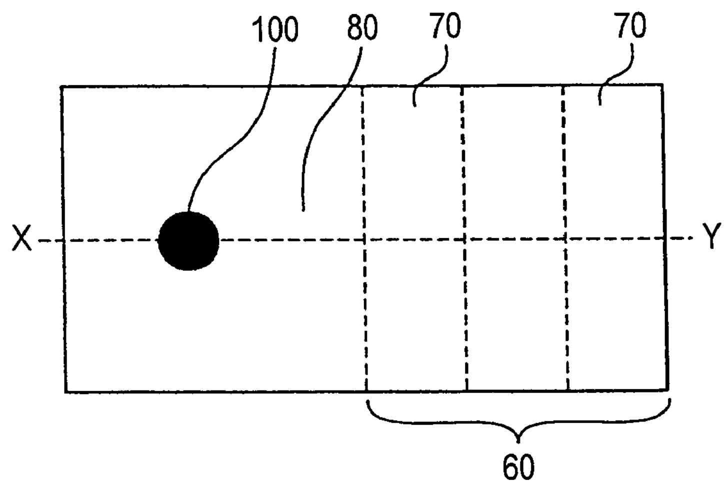

FIG. 5B is a plan view showing a second embodiment according to the invention. Furthermore, FIG. 5A is a sectional view showing a cross section when FIG. 5B is cut along a dotted line XY. In the following, the second embodiment according to the invention will be explained with reference to FIGS. 5A and 5B. The second embodiment according to the invention is a semiconductor device that uses an SOI substrate and corresponds to a semiconductor device fabricated by use of the first embodiment.

The second semiconductor device according to the invention is formed on a buried oxide film 20 formed on a support substrate 10.

An SOI layer 30 and an element isolation layer 50 are disposed on the buried oxide film 20. A semiconductor element 60 that has a diffusion layer 70 is formed in the SOI layer 30. Furthermore, in a region close to the buried oxide film 20 of the support substrate 10, an impurity such as As or the like is ion implanted at such a high concentration as substantially 1E20 cm−3, the portion being the low electric resistance layer 40. Still furthermore, the low electric resistance layer 40 extends from the lower portion of the element isolation region 50 to the lower portion of the SOI layer 30.

Furthermore, on the SOI layer 30 and the element isolation layer 50, an interlayer insulating film 80 is formed. Still furthermore, a plug 100 that penetrates through each of the interlayer insulating film 80, the element isolation layer 50 and the buried oxide film 20, is made of W and reaches down to the surface of the support substrate 10 is formed. Furthermore, the bottom portion of the plug 100 is the adhesion layer 95 made from TiN. That is, the adhesion layer 95 at the bottom portion of the plug 100 comes into contact with the low electric resistance layer 40.

As explained above, the semiconductor device according to the second embodiment of the invention has, in the neighborhood of the oxide film of the support substrate, a low electric resistance layer that extends from the lower portion of the SOI layer to the lower portion of the element isolation layer. Furthermore, a contact is connected to the low electric resistance layer thereof. When the structure is shown with a circuit diagram, it becomes like FIG. 6. In the following, an effect of the second embodiment according to the invention will be explained with reference to FIG. 6.

Figure 6:
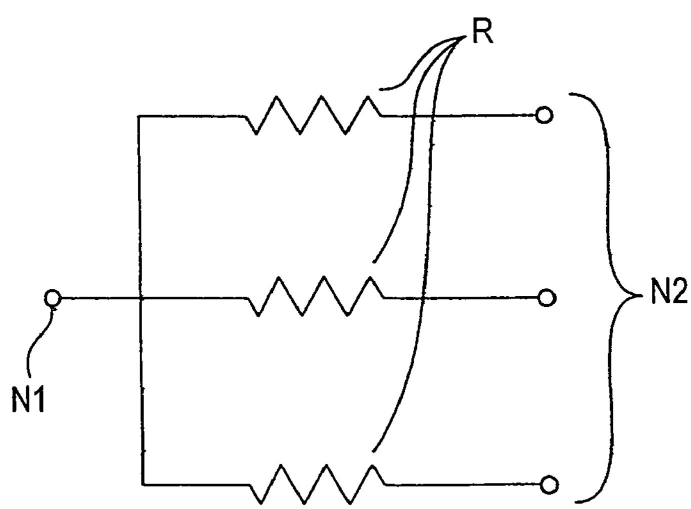
FIG. 6 is a circuit diagram for explaining an effect of the second embodiment according to the invention.

In FIG. 6, node N1 is the plug 100; respective nodes N2 are portions that are at a lower portion of the SOI layer 30 of the low electric resistance layer 40; and wiring resistance R is a portion that extends from the plug 100 to the lower portion of the SOI layer 30 of the low electric resistance layer 40.

When the operation of the transistor 60 is controlled, in some cases, an electrical potential of the low electric resistance layer 40 of a portion that is on an opposite side through the buried oxide film 20 to the transistor 60 is adjusted. At this time, the low electric resistance layer 40 (hereinafter referred to as N2) of the portion, as shown in FIG. 6, is electrically connected to the plug 100 (hereinafter referred to as N1); accordingly, when a electrical potential of the N1 is varied, a electrical potential of the N2 can be adjusted.

When the electrical potential of N1 is varied, electrical potential difference is generated between the N1 and N2; accordingly, an electric current flows between the N1 and N2. Owing to the electric current, electric charges move from the N1 to the N2, finally the N1 and N2 become the same in the electrical potential. This is the mechanism by which the electrical potential of N2 is adjusted. However, at this time, there is the wiring resistance R between the N1 and N2; accordingly, when the electrical potential difference between the N1 and N2 is determined, according to the Ohm's law, a magnitude of the electric current is also determined. The electric current becomes larger as a value of the wiring resistance R becomes smaller. Accordingly, the smaller the wiring resistance R is, the larger is an electric current that can be flowed between the N1 and N2. Furthermore, an electric current denotes an amount of electric charges that flow in a unit time. Accordingly, since as the electric current becomes larger, the electric charges move more rapidly, the electrical potential of the N2 can be swiftly changed with respect to the change of electrical potential of N1.

In the second embodiment of the invention, since the low electric resistance layer extends from the plug to the lower portion of the SOI layer, a larger electric current can be flowed from the plug to the support substrate at the lower portion of the SOI layer. Accordingly, when the electrical potential of the support substrate at the lower portion of the SOI layer is manipulated in order to control the operation of the transistor formed in the element formation region in the SOI layer, the electrical charges can be rapidly supplied to the support substrate at the lower portion of the SOI layer. Accordingly, the electrical potential of the support substrate at the lower portion of the SOI layer can be rapidly manipulated.

As mentioned above, in the method of fabricating the semiconductor device described in the first embodiment according to the invention, irrespective of the aspect ratio of the contact hole, the impurity can reach down to the support substrate. Furthermore, since the ion implantation of the impurity is applied to the support substrate of a completed SOI wafer, there is no chance that owing to heat during the lamination, the impurity that is ion implanted to the support substrate diffuses to increase the electric resistance of a region where the impurity is ion implanted, namely, the low electric resistance layer. On the other hand, the semiconductor device according to the second embodiment of the invention allows rapidly manipulating the electric potential of the support substrate at the lower portion of the element formation region.

What is claimed is:

1. A method of fabricating a semiconductor device comprising:

providing a support substrate;

forming, on the support substrate, through an oxide film, an SOI layer that has an element formation region and an element isolation region;

implanting an impurity to the support substrate through the SOI layer in the neighborhood of a boundary between the element formation region and the element isolation region so as to form a low electric resistance layer on the support substrate that extends from a lower portion of the element formation region to a lower portion of the element isolation region;

heating the support substrate;

forming an element isolation layer in the element isolation region of the SOI layer; and forming a contact that penetrates through the element isolation layer and the oxide film in the neighborhood of the boundary between the element formation region and the element isolation region to reach the low electric resistance layer.

2. A method of fabricating a semiconductor device as set forth in claim 1:

wherein the contact has an adherence layer in a portion that comes into contact with the support substrate.

3. A method of fabricating a semiconductor device as set forth in claim 1:

wherein the impurity is As.

4. A method of fabricating a semiconductor device as set forth in claim 1 further comprising:

forming a semiconductor element having a diffusion layer in the element formation region of the SOI layer;

wherein heat treatment of the diffusion layer and heat treatment of the support substrate are simultaneously applied.

5. A method of fabricating a semiconductor device as set forth in claim 1 further comprising:

forming an element isolation layer in the element isolation region of the SOI layer by use of heat treatment;

wherein heat treatment of the element isolation layer and heat treatment of the support substrate are simultaneously applied.

6. A method of manufacturing a semiconductor device, comprising:

providing an SOI substrate having an element formation region and an isolation region, the SOI substrate including a semiconductor substrate, a buried insulating layer formed on the semiconductor substrate and an SOI layer formed on the buried insulating layer;

introducing an impurity into the semiconductor substrate around a boundary between the element formation region and the isolation region through the buried insulating layer and the SOI layer so that an impurity region extending from the element formation region to the isolation region is formed on the semiconductor substrate;

subjecting the SOI substrate to a heat treatment;

forming an isolation layer in the isolation region so that the SOI layer in the element formation region is surrounded by the isolation layer;

forming a through hole in the isolation region near the element formation region through the isolation layer and the buried insulating layer so that the through hole exposes the impurity region; and filling a conductive material into the through hole.

7. A method of manufacturing a semiconductor device according to claim 6, wherein said introducing includes implanting impurity ions into the semiconductor substrate.

8. A method of manufacturing a semiconductor device according to claim 6, wherein the impurity is As.

9. A method of manufacturing a semiconductor device according to claim 6, wherein the isolation layer is formed by a LOCOS method.

10. A method of manufacturing a semiconductor device according to claim 6, wherein the conductive material includes an adhesion layer made of TiN formed on the impurity region and a plug formed on the adhesion layer.

11. A method of manufacturing a semiconductor device according to claim 10, wherein the plug is made of W.

12. A method of manufacturing a semiconductor device according to claim 10, wherein the plug is made of polysilicon.

13. A method of manufacturing a semiconductor device, comprising:

providing an SOI substrate having an element formation region and an isolation region, the SOI substrate including a semiconductor substrate, a buried oxide layer formed on the semiconductor substrate and an SOI layer formed on the buried oxide layer;

introducing ions into the semiconductor substrate in an area including a boundary between the element formation region and the isolation region through the buried oxide layer and the SOI layer so as to form a low resistive layer extending from the element formation region to the isolation region on the semiconductor substrate;

subjecting the SOI substrate to a heat treatment;

forming an isolation layer in the isolation region so that the SOI layer in the element formation region is surrounded by the isolation layer;

forming a contact hole in the isolation region within an area through the isolation layer and the buried oxide layer so that the contact hole exposes the low resistive layer; and filling a conductive material into the contact hole.

14. A method of manufacturing a semiconductor device according to claim 13, wherein said introducing includes implanting As ions into the semiconductor substrate.

15. A method of manufacturing a semiconductor device according to claim 13, wherein the isolation layer is formed by a LOCOS method.

16. A method of manufacturing a semiconductor device according to claim 13, wherein the conductive material includes an adhesion layer made of TiN formed on the low resistive layer and a plug formed on the adhesion layer.

17. A method of manufacturing a semiconductor device according to claim 16, wherein the plug is made of W.

18. A method of manufacturing a semiconductor device according to claim 16, wherein the plug is made of doped polysilicon.

* * * * *